US010944424B1

United States Patent
Wang et al.

(10) Patent No.: US 10,944,424 B1
(45) Date of Patent: Mar. 9, 2021

(54) ERROR CORRECTION WITH MULTIPLE LLR-LUTS FOR A SINGLE READ

(71) Applicant: Seagate Technology LLC, Cupertino, CA (US)

(72) Inventors: Zheng Wang, Louisville, CO (US); Ara Patapoutian, Hopkinton, MA (US); Deepak Sridhara, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 100 days.

(21) Appl. No.: 16/142,957

(22) Filed: Sep. 26, 2018

(51) Int. Cl.
| H03M 13/00 | (2006.01) |
| H03M 13/11 | (2006.01) |
| H04L 1/00 | (2006.01) |
| G06F 11/10 | (2006.01) |
| G11C 16/26 | (2006.01) |
| G11C 11/56 | (2006.01) |

(52) U.S. Cl.
CPC ..... *H03M 13/1137* (2013.01); *G06F 11/1068* (2013.01); *G11C 11/5642* (2013.01); *G11C 16/26* (2013.01); *H04L 1/005* (2013.01); *H04L 1/0057* (2013.01)

(58) Field of Classification Search
None
See application file for complete search history.

(56) References Cited

U.S. PATENT DOCUMENTS

| 7,281,192 | B2 | 10/2007 | Shen et al. | |
| 8,935,600 | B1 * | 1/2015 | Varnica | H03M 13/2957 |
| | | | | 714/759 |
| 9,008,242 | B2 * | 4/2015 | Drumm | H03M 13/2957 |
| | | | | 375/341 |
| 2006/0168500 | A1 * | 7/2006 | Whinnett | H04L 1/005 |
| | | | | 714/794 |
| 2008/0244338 | A1 * | 10/2008 | Mokhlesi | G06F 11/1068 |
| | | | | 714/702 |

(Continued)

OTHER PUBLICATIONS

D. Wu, Y. Chen, Q. Zhang, Y. Ueng and X. Zeng, "Strategies for Reducing Decoding Cycles in Stochastic LDPC Decoders," in IEEE Transactions on Circuits and Systems II: Express Briefs, vol. 63, No. 9, pp. 873-877, Sep. 2016, doi: 10.1109/TCSII.2016.2535038. (Year: 2016).*

*Primary Examiner* — Daniel F. McMahon
(74) *Attorney, Agent, or Firm* — Kirk A. Cesari; Christian W. Best (57) ABSTRACT

Systems and methods are disclosed for error correction with multiple log likelihood ratio (LLR) lookup tables (LUTs) for a single read, which allows for adaptation to asymmetry in the number of 0 or 1 bit errors without re-read operations. In certain embodiments, an apparatus may comprise a circuit configured to receive a sequence of bit value estimates for data read from a solid state memory during a single read operation, generate a first sequence of LLR values by applying the sequence of bit value estimates to a first LUT, and perform a decoding operation on the first sequence of LLR values. When the first sequence of LLR values fails to decode, the circuit may be configured to generate a second sequence of LLR values by applying the bit value estimates to a second LUT, and perform the decoding operation on the second sequence of LLR values to generate decoded data.

20 Claims, 7 Drawing Sheets

(56) References Cited

U.S. PATENT DOCUMENTS

| | | | |
|---|---|---|---|
| 2008/0244360 A1* | 10/2008 | Mokhlesi | G06F 11/1068 714/758 |
| 2011/0083060 A1* | 4/2011 | Sakurada | G11C 11/5642 714/763 |
| 2013/0070828 A1* | 3/2013 | Das | H04L 27/22 375/226 |
| 2013/0077400 A1* | 3/2013 | Sakurada | G11C 11/5642 365/185.03 |
| 2014/0040704 A1 | 2/2014 | Wu et al. | |
| 2014/0281828 A1* | 9/2014 | Micheloni | G06F 11/00 714/773 |
| 2014/0359394 A1* | 12/2014 | Gasanov | H03M 13/1111 714/758 |
| 2016/0006462 A1 | 1/2016 | Hanham et al. | |
| 2016/0027521 A1* | 1/2016 | Lu | G11C 16/26 714/764 |
| 2017/0236592 A1* | 8/2017 | Alhussien | G11C 29/50004 714/721 |
| 2017/0262334 A1* | 9/2017 | Uchikawa | G11C 16/10 |
| 2017/0264320 A1* | 9/2017 | Lin | H03M 13/1545 |

* cited by examiner

Table 1 — 502

| Input (Hard Information) | 0 | 1 |
|---|---|---|
| Output (LLR value) | 7 | -7 |

Table 2 — 504

| Input (Hard Information) | 0 | 1 |
|---|---|---|
| Output (LLR value) | 7 | -3 |

Table 3 — 506

| Input (Hard Information) | 0 | 1 |
|---|---|---|
| Output (LLR value) | 7 | 0 |

Table 4 — 508

| Input (Hard Information) | 0 | 1 |
|---|---|---|
| Output (LLR value) | 3 | -7 |

Table 5 — 510

| Input (Hard Information) | 0 | 1 |
|---|---|---|
| Output (LLR value) | 0 | -7 |

ERROR CORRECTION WITH MULTIPLE LLR-LUTS FOR A SINGLE READ

SUMMARY

In certain embodiments, an apparatus may comprise a circuit configured to receive a sequence of bit value estimates for data read from a solid state memory during a single read operation, generate a first sequence of log likelihood ratio (LLR) values by applying the sequence of bit value estimates to a first lookup table (LUT), and perform a decoding operation on the first sequence of LLR values. When the first sequence of LLR values fails to decode, the circuit may be configured to generate a second sequence of LLR values by applying the sequence of bit value estimates to a second LUT, and perform the decoding operation on the second sequence of LLR values to generate decoded data.

In certain embodiments, a method may comprise receiving, at a data channel circuit, a sequence of bit value estimates for data read from a solid state memory during a single read operation, generating a first sequence of log likelihood ratio (LLR) values by applying the sequence of bit value estimates to a first lookup table (LUT), and performing a decoding operation on the first sequence of LLR values. When the first sequence of LLR values fails to decode, the method may comprise generating a second sequence of LLR values by applying the sequence of bit value estimates to a second LUT, and performing the decoding operation on the second sequence of LLR values to generate decoded data.

In certain embodiments, an apparatus may comprise a circuit configured to execute a single read to a solid state memory to generate a sequence of bit value estimates, generate a plurality of log likelihood ratio (LLR) value sequences by applying the sequence of bit value estimates to a plurality of lookup tables (LUTs), each LUT configured to address different degrees of asymmetry in bit errors when reading 0's and when reading 1's, and perform a decoding operation based on the plurality of LLR value sequences. The decoding operation may include selecting a selected LUT from the plurality of LUTs, and iteratively updating a parity state based on a selected sequence of LLR values associated with the selected LUT. When the selected sequence of LLR values fails to decode, the decoding operation may include selecting a next LUT from the plurality of LUTs as the selected LUT. The decoding operation may produce decoded data when the selected sequence of LLRs successfully decodes.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
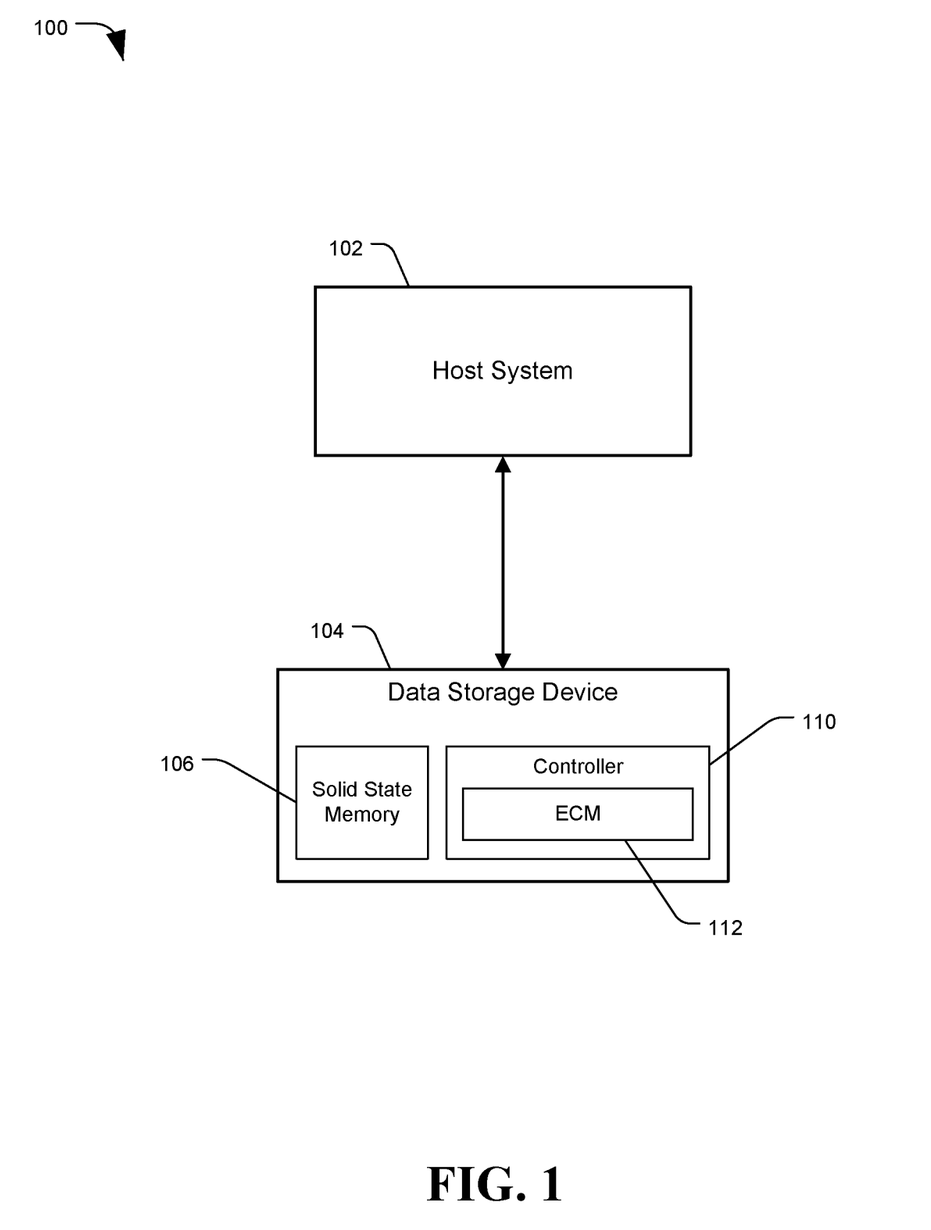
FIG. 1 is a diagram of a system configured to perform error correction with multiple LLR-LUTs for a single read, in accordance with certain embodiments of the present disclosure.

FIG. 1 is a diagram of a system, generally designated 100, configured to perform error correction with multiple log likelihood ratio (LLR) lookup tables (LUTs) for a single read, in accordance with certain embodiments of the present disclosure. The system 100 may include a data storage device (DSD) 104, such as a storage drive or any other device which may be used to store or retrieve data, including a solid state drive (SSD) or hybrid drive. As used herein, a data storage drive may refer to a device specifically adapted for data storage and retrieval to a memory internal to the drive, not including more general purpose processing devices such as computers and smart devices, although the DSD 104 and the teachings herein are not limited to such drives. The DSD 104 may include a memory 106 and a controller 110. The memory 106 may comprise one or more non-volatile memory (NVM) data storage mediums, such as solid state memory (sometimes referred to herein as SSM or NVSSM) including NAND flash memory, other types of memory, or a combination thereof. The controller 110 may be one or more processors or circuits configured to perform data access operations, such as reads or writes (also called program operations), to the memory 106. Data retrieved from the memory 106, or to be stored to the memory 106, may be processed via the controller 110, a read/write (R/W)

channel, or other elements for encoding or decoding data, error correction, or other processing.

The system 100 may include a host device 102, which may also be referred to as the host system, host computer, or simply 'host'. The host 102 can be one or more server-class computers, desktop computers, laptop computers, workstations, tablet computers, telephones, music players, set top boxes, a control system of a self-driving vehicle, other electronic devices, or any combination thereof. The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing). The host 102 may issue data access requests, such as read or write requests, to the DSD 104. In response, the DSD 104 may perform data access operations on the memory 106 via the controller 110 based on the requests.

Data may be stored to the memory 106 as a sequence of bits, with each bit having either a 0 value or a 1 value. Errors may arise when data is stored to or read from the memory 106, which can result in the data becoming corrupted or unreadable, such as when a 0 is read as a 1 or vice-versa. In order to avoid the loss of data due to errors, the DSD 104 may include an error correction module (ECM) 112 configured to correct errors from a data stream. The ECM 112 may attempt to identify bits that may be incorrect and change them to restore the correct data pattern. The ECM 112 may include one or more circuits, firmware, or other components, and may be located at the controller 110, a R/W channel between the controller 110 and the memory 106, distributed among multiple components, or otherwise located in the DSD 104. An example embodiment of system 100, including a more detailed diagram of DSD 104, is depicted in FIG. 2.

Figure 2:
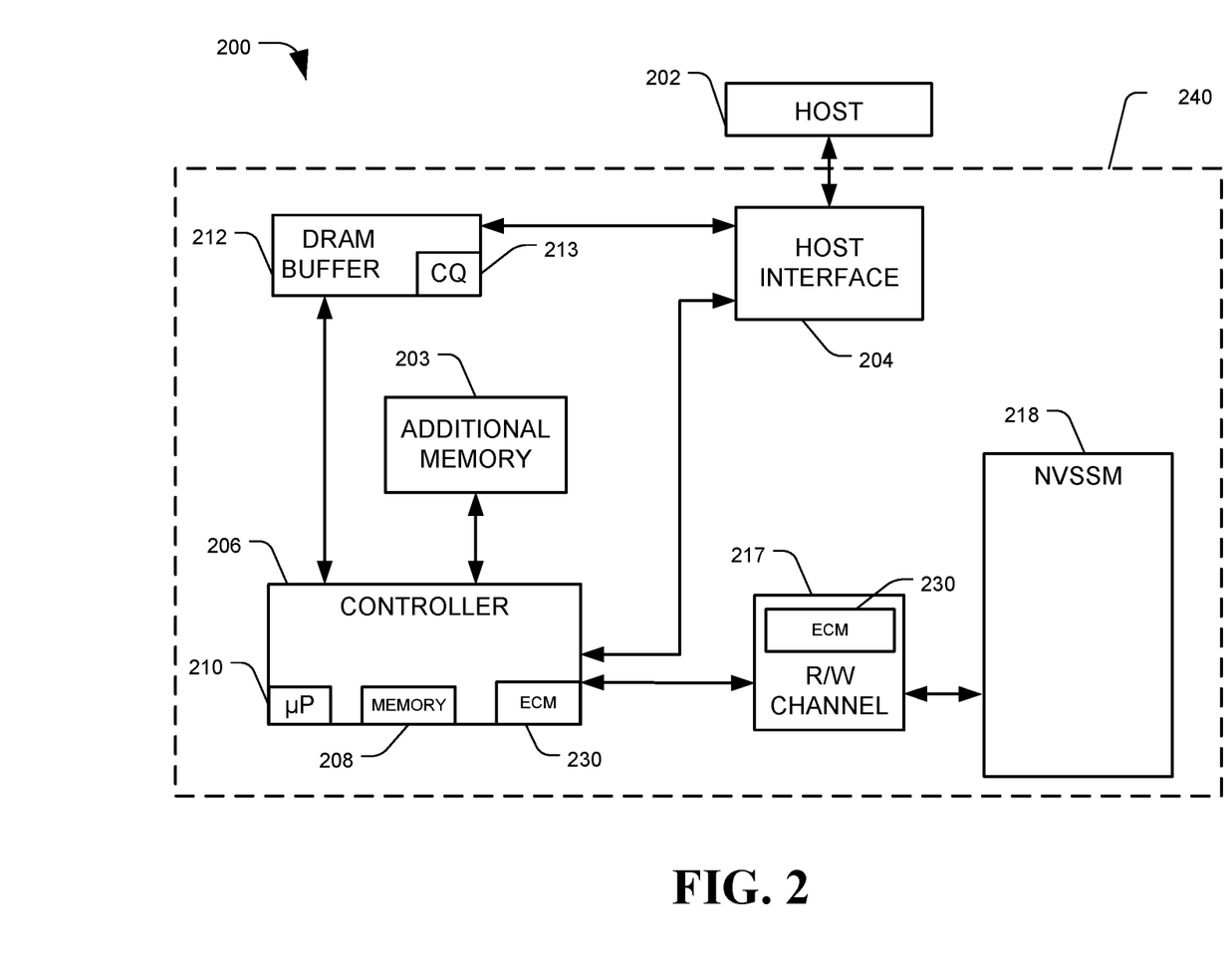
FIG. 2 is a diagram of a system configured to perform error correction with multiple LLR-LUTs for a single read, in accordance with certain embodiments of the present disclosure.

FIG. 2 is a diagram of a system, generally designated 200, configured to perform error correction with multiple log likelihood ratio (LLR) lookup tables (LUTs) for a single read, in accordance with certain embodiments of the present disclosure. Specifically, FIG. 2 provides a functional block diagram of an example data storage device (DSD) 200, which may be an example of the DSD 104 of FIG. 1. The DSD 200 may also be referred to as solid state drive (SSD) 200, according to some embodiments. The DSD 200 can communicate with a host device 202 (such as the host system 102 shown in FIG. 1) via a hardware or firmware-based interface circuit 204. The interface 204 may comprise any interface that allows communication between a host 202 and a DSD 200, either wired or wireless, such as USB, IEEE 1394, Compact Flash, SATA, eSATA, PATA, SCSI, SAS, PCIe, Fibre Channel, Ethernet, or Thunderbolt, among others. The interface 204 may include a connector that allows the DSD 200 to be physically removed from the host 202. The DSD 200 may have a casing 240 housing the components of the DSD 200.

The buffer 212 can temporarily store data during read and write operations, and can include a command queue (CQ) 213 where multiple operations can be temporarily stored pending execution. Commands arriving over the interface 204 may automatically be received in the CQ 213 or may be stored there by controller 206, interface 204, or another component.

The DSD 200 can include a programmable controller 206, which can include associated memory 208 and processor 210. The controller may execute firmware (FW) to control the operations of the DSD 200. The controller 206 may control data access operations, such as reads and writes, to one or more nonvolatile solid state memories (NVSSM) 218, such as NAND flash memory. The DSD 200 may include an additional memory 203 instead of or in addition to NVSSM 218. For example, additional memory 203 can be either volatile memory such as DRAM or SRAM, disc-based nonvolatile memories such as magnetic hard discs, other types of memory, or a combination thereof. The additional memory 203 can function as a working memory for storing generated parity data, a cache to store recently or frequently read or written data, or data likely to be read soon, or for other temporary data storage. Additional memory 203 may also function as main long-term storage instead of or in addition to NVSSM 218. A DSD 200 containing multiple types of nonvolatile storage mediums, such as a disc(s) and flash, may be referred to as a hybrid storage device.

The DSD 200 can include a read-write (R/W) channel 217, which can encode data during write operations and reconstruct user data retrieved from a memory, such as NVSSM 218, during read operations.

DSD 200 may include an error correction module (ECM) 230. The ECM 230 may be included in the controller 206, the R/W channel 217, in other components, as a stand-alone component, or any combination thereof. The ECM 230 may perform the methods and processes described herein to apply multiple LLR-LUTs for single-read error correction, as described herein. Example details of error correction will be described in regard to FIG. 3.

Figure 3:
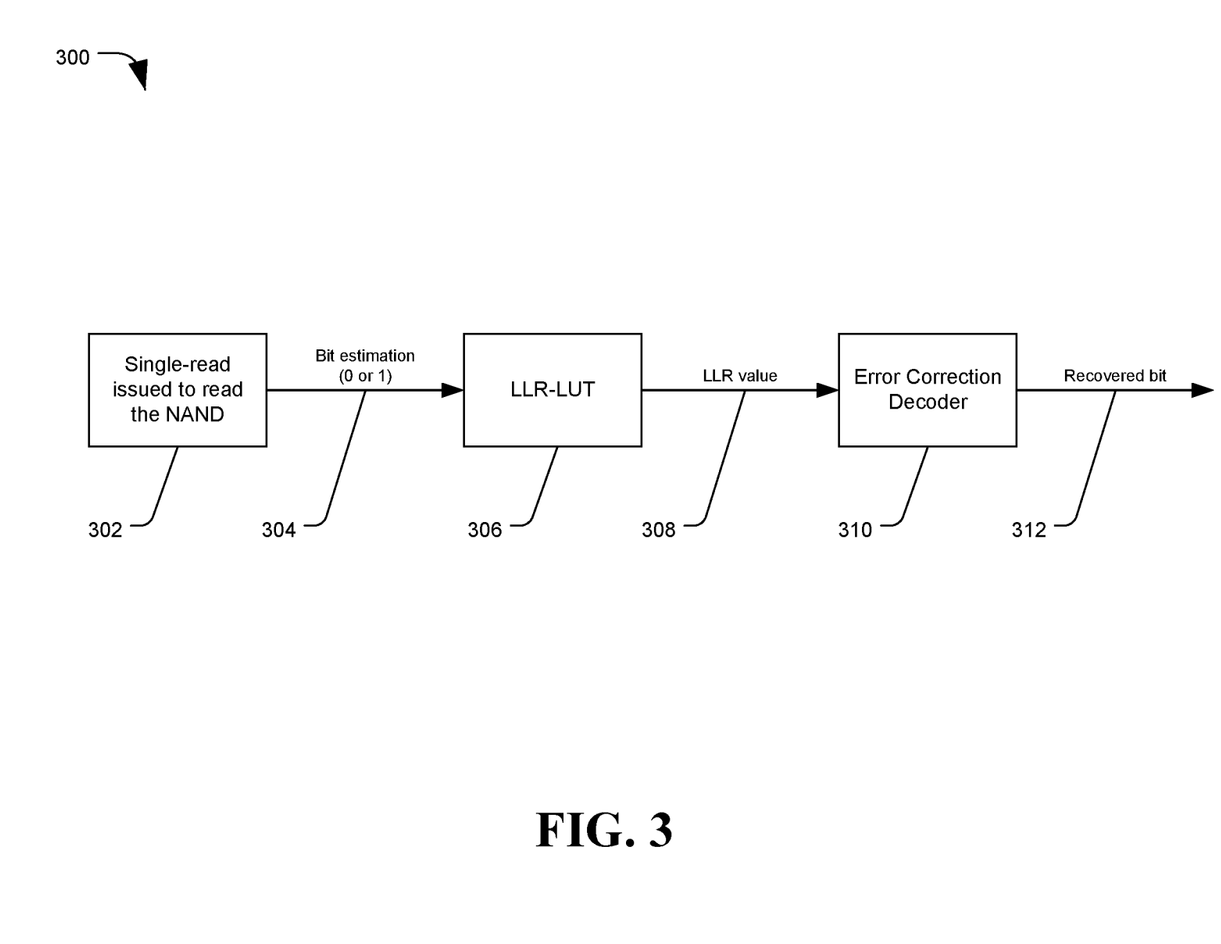
FIG. 3 is a system flow diagram of a system configured to perform error correction with multiple LLR-LUTs for a single read, in accordance with certain embodiments of the present disclosure

FIG. 3 is a system flow diagram, generally designated 300, of a system configured to perform error correction with multiple log likelihood ratio (LLR) lookup tables (LUTs) for a single read, in accordance with certain embodiments of the present disclosure. The system flow diagram 300 may be performed by a read channel circuit of a data storage device (DSD), which may perform processing, error correction, and decoding operations on read data prior to providing the data to a controller or processor for the DSD.

In some examples, a DSD may receive a read request from a host device, for which the host expects a prompt response. The firmware (FW) at the DSD controller may initiate a read operation (in response to the host read request, or in some examples for internal system operations not based on host requests). In many DSDs, if data cannot be read on a first attempt, the FW may instruct the read channel to perform re-reads to make additional attempts to retrieve the data from the storage medium. However, performing re-reads can be a slow process, and can lead to performance inefficiencies in the amount of time a DSD takes in order to complete a read operation. One way to mitigate errors is to encode data with an error correction code (ECC) prior to storing the data, which ECC may be used to attempt to correct errors that arise when the data is read. However, ECCs may be limited in the amount of errors that they allow the DSD to correct, and re-reads may still be needed to attempt to correct significant errors.

In many memory systems, such as NAND flash memory, ECCs that utilize log likelihood ratios (LLRs) for decoding, and ECCs such as low density parity check (LDPC) codes, can play an important role in data recovery. Diagram 300 depicts the application of an example ECC that employs LLR-LUTs. Data recovery may be performed during two different phases or modes of operation of the DSD: an on-the-fly data decoding mode, and a data recovery or error recovery mode. The on-the-fly mode may refer to an initial read attempt and the associated initial error recovery and data decoding operations. The on-the-fly mode may be considered "normal" uninterrupted operation when reading data, as data bit estimates are retrieved from the memory, minor errors are corrected, and the data is decoded and returned in response to the read request. In on-the-fly mode, the DSD may be limited to data decoding based on "hard" information, and information that can be derived directly from the hard information. Hard information may refer to bit values read from the memory (e.g. a value of "0" or "1" for each bit).

In the error recovery mode, the initial read and decoding failed to produce the correct data. The DSD in error recovery mode may initiate a slower series of processes intended to recover, rather than simply "read", data with heavy errors. Error recovery mode can include performing multiple re-read operations to gather "soft" information. During re-reads of solid state memories like NAND flash, the DSD may apply a variety of different read voltage thresholds, and can evaluate how the read bit values change using the different thresholds. This can generate "soft" information which can provide additional insights into which bits are most reliable. For example, if adjusting the read thresholds up and down produces no change in a given bit value, then the bit is likely to be stable and correct. If adjusting the read threshold changes the bit value, then the bit value may be less "reliable". The additional soft information can be used with different LLR-LUTs to assign different LLRs to the 0's and 1's, and error recovery with soft information could be attempted. By performing multiple re-reads and obtaining soft information, the DSD may be able to gradually determine the nature of the errors and compensate for them. However, as discussed, re-reads and the associated additional error recovery operations may be slow and inefficient, with a large performance penalty compared to performing a single read in on-the-fly mode. For example, a re-read may take in the order of 100 microseconds, while running decoder operations may only take a few microseconds. Performing multiple re-reads, therefore, introduces an extremely large delay relative to decoder-based recovery procedures alone.

As stated above, a DSD operating in on-the-fly mode may perform a single read to obtain "hard" information bit values from the data storage medium, at 302, without additional "soft" information to determine a reliability of the bits. However, ECC schemes such as LDPC may take LLRs as inputs, rather than individual bit values. Accordingly, the hard information bit estimates may be provided or applied, at 304, as input to a LLR-LUT 306. At the LLR-LUT 306, an input bit value may be used to look up or map to a corresponding LLR for the bit value, which may be used as an output for the LLR-LUT. An LLR value may act as a "confidence" rating that the bit value is correct, and may translate to a bit error ratio or rate (BER). For example, an LLR value may correspond to the log of the probability of a bit error for a given bit, such that a specific bit error rate may translate to a particular LLR value. However, when the only data available is the hard information bit estimates of 0 or 1, then the LLR values for each bit can only be "guessed" at or estimated using the LLR-LUT. In some examples, the LLR value may be within a range, for example from −7 to 7, with negative LLR values corresponding to "1" bit values and positive LLR values corresponding to "0" bit values (although the opposite correlation may also be used). A higher absolute value of the LLR may corresponding to greater "confidence" that the bit value is correct, while absolute LLR values closer to 0 may represent lower confidence ratings. An LLR value of 0 may indicate that the actual value of the bit is unknown with any certainty.

The LLR values 308 may be provided to an error correction decoder 310. The error correction decoder 310 may apply an ECC algorithm, such as LDPC codes, based on the LLR values to attempt to decode the read data. The decoder may perform multiple decoding iteration attempts to recover the data, and may be able to recover additional bits as the iterations proceed. If the data is successfully decoded, the successfully decoded or recovered bits 312 may be provided to a controller or otherwise passed to further components along a read channel. If the data fails to decode, a read failure notification may be generated, and may be provided to the FW at the controller. The FW may then order re-read operations, or may determine that the read has failed and return a failure indication to the host (e.g. in response to reaching a command timeout). An example iterative error correction operation is described in regard to FIG. 4.

Figure 4:
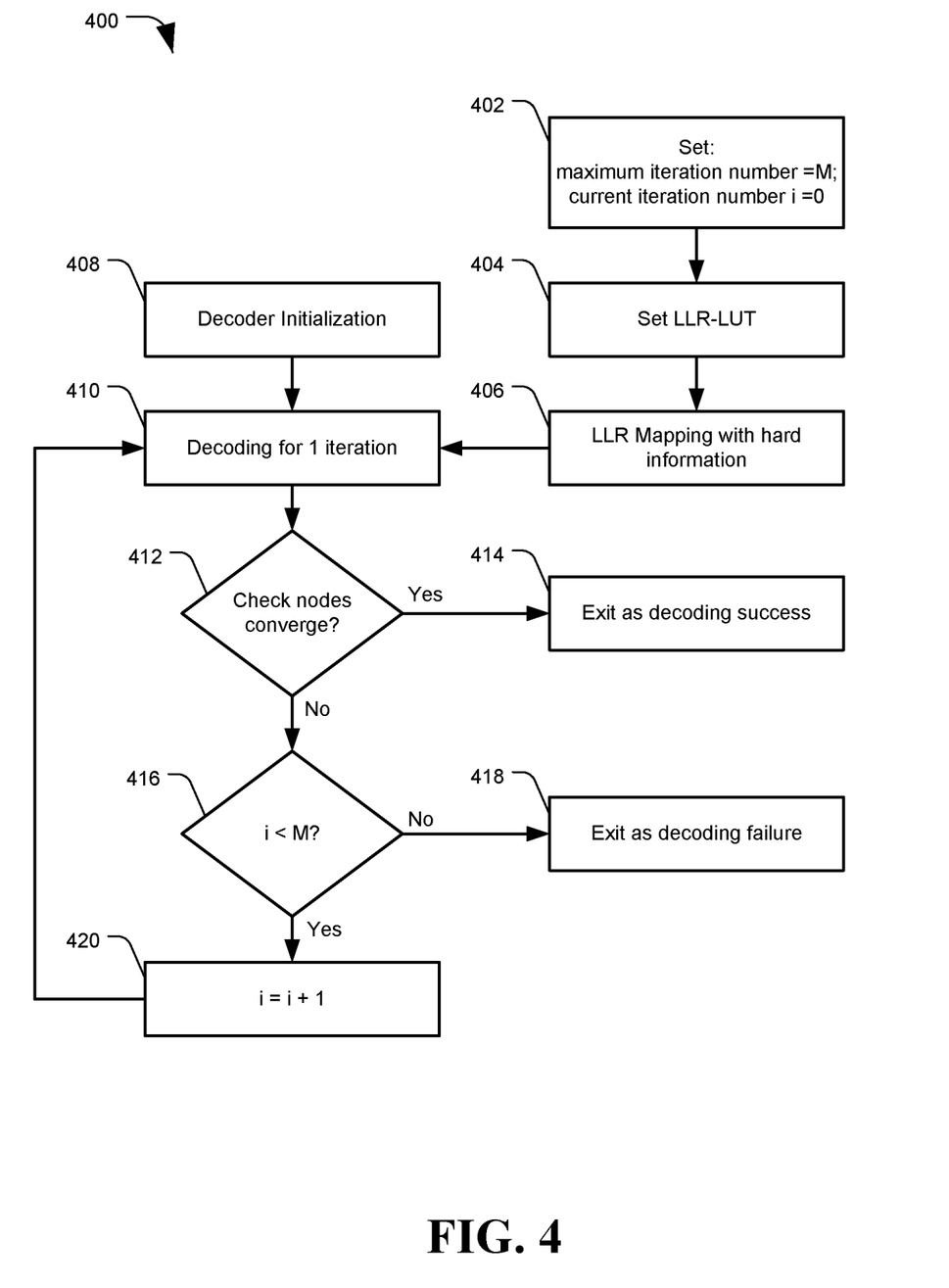
FIG. 4 depicts a flowchart of an example method for an iterative error correction process, in accordance with certain embodiments of the present disclosure.

FIG. 4 depicts a flowchart of a method, generally designated 400, for an iterative error correction process, which may employ a single LLR-LUT. The method 400 may be performed by a data storage device (DSD), such as by an error correction module (ECM) of the controller and read channel circuit of DSD 200 of FIG. 2.

The method 400 may include setting a maximum iteration number for an error correction and decoding process to a selected value "M", and setting the current iteration number "i" to 0, at 402. Next the method 400 may include setting or selecting an LLR-LUT to use in mapping the hard-data bit value estimates to LLR values, at 404. The select LLR-LUT may be a "default" or base LLR-LUT that maps all "0" bit estimates to a first LLR value and all "1" bit estimates to a second LLR value. The hard information bit values may then be mapped to LLR values based on the selected LLR-LUT, and provided to a decoder, at 406.

Prior to the iterative decoding portion of the operation, the decoder may be initialized at 408. Initializing a LDPC decoder may include setting internal decoder parameters and states to initial values. For example, initialization may include zeroing out a check node (or "cnode") state used to calculate parity information for a set of data. The check node state, sometimes called a parity check state or parity state, may be updated over multiple iterations to correct bit errors, which may eventually lead to the check node "converging" when all bits have been successfully recovered. At 410, the decoder may perform an iteration of the decoding operation based on the LLR values mapped from the hard information bit value estimates. A determination may be made whether the check node has converged, at 412. If yes, the method 400 may exit as a decoding success at 414, and the decoded data may be returned to the controller or host. If the check node did not converge, the method 400 may include determining whether the current iteration number "i" is less than the maximum iteration number "M", at 416. If not, then the maximum number of iterations has been reached and the method 400 may exit as a decoding failure, at 418. A notification may be sent to the FW that the data failed to decode, and the FW may determine whether to attempt reread operations or report a read failure notification to a host. If "i" is less than "M," the method 400 may include incrementing the current iteration number "i" by a selected value, such as 1, at 420, and performing another decoding iteration, at 410. In some embodiments, the convergence check of 412 may be performed once per full iteration of a codeword (an amount of data decoded at a time), or it may be performed every time the cnode is updated, depending on implementation and design of the decoder.

An example default or base LLR-LUT may be configured to provide equal confidence rating to 0's and 1's, such that all "1" bit values map to an LLR of −7, and all "0" bit values map to an LLR of 7. In the example of method 4, the LLR mapping may be static during the decoding process. In other words, the decoder may use one set of values from a single LLR-LUT for every iteration of the decoding and data recovery process. If the decoding with hard information fails, other error recovery schemes (e.g. error correction with soft information) could be executed. For example, if the initial read fails to decode in on-the-fly mode (e.g. at 418), the FW may issue re-read commands. During the re-reads, the DSD may generate "soft" information indicating the reliability of the read bits. However, as discussed herein generating soft information during an error recovery mode may be slow and inefficient compared to performing a single read.

Accordingly, improved techniques for on-the-fly decoding based on an initial read can enhance DSD performance. In practice, raw bit errors coming out of the memory, e.g. from problematic pages of flash memory, may not be symmetric (e.g. an equal number of errors for 0 bit values and 1 bit values). Asymmetry in the errors may result in there being more "0" bit values incorrectly read as "1" than there are "1" bit values incorrectly read as a "0", or vice-versa. In such examples, one "type" of error (e.g. 0-to-1 errors) may dominate the total bit errors. This may occur even when the read voltage threshold is optimized for a group of flash pages. This type of error asymmetry may be exploited by applying multiple asymmetric LLR-LUTs for hard-data error correction decoding, without performing additional reads. An example set of LLR-LUTs is described in regard to FIG. 5.

Figure 5:
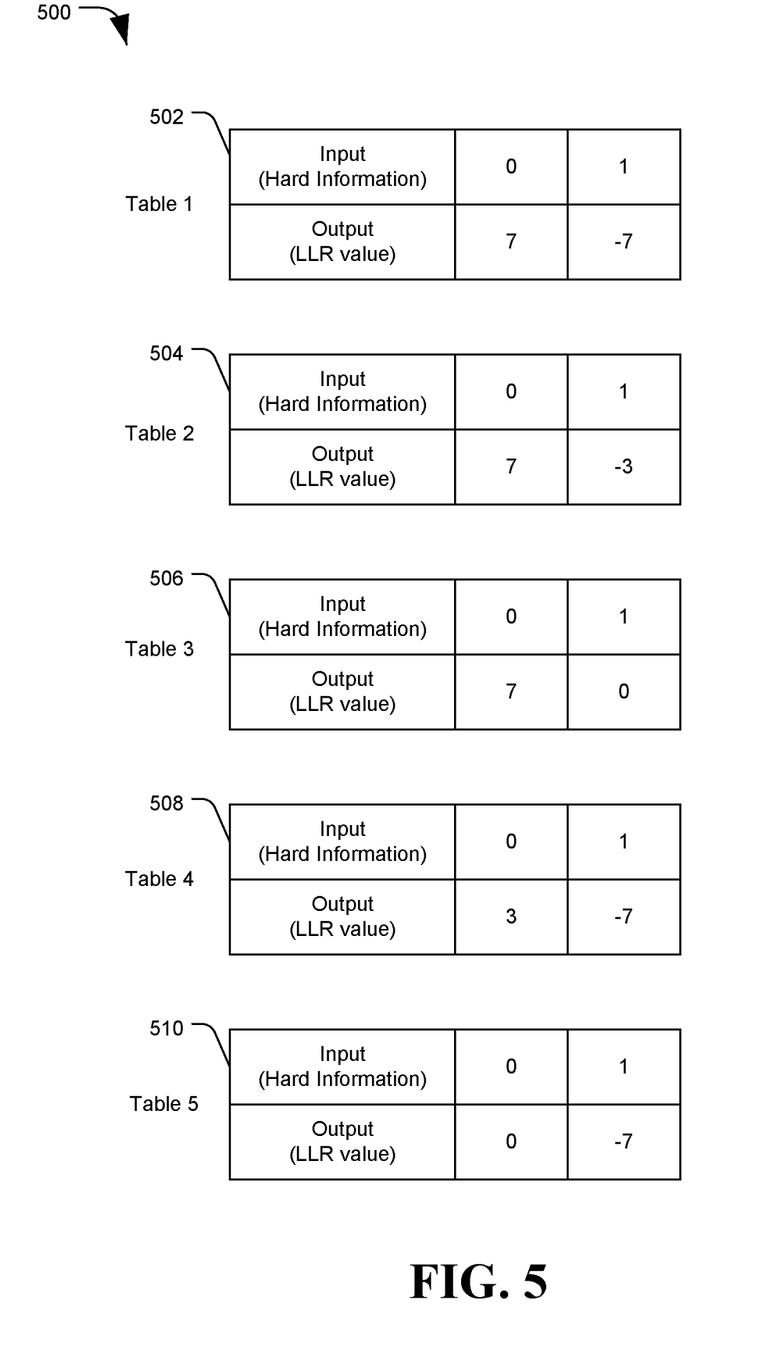
FIG. 5 is a diagram of a system configured to perform error correction with multiple LLR-LUTs for a single read, in accordance with certain embodiments of the present disclosure.

FIG. 5 is a diagram of a system, generally designated 200, configured to perform error correction with multiple log likelihood ratio (LLR) lookup tables (LUTs) for a single read, in accordance with certain embodiments of the present disclosure. Specifically, FIG. 5 depicts five example LLR-LUTs, numbered 502 through 510, which may be used to map hard information bit values to LLR values for the purposes of error correction and decoding.

As described above, the LLR values may represent a "confidence" for a bit value, and may range from, e.g. −7 to 7. A −7 may represent a high confidence rating that the bit value is a "1", while a 7 may represent a high confidence rating that the bit value is a "0". Negative and positive LLR values closer to 0 may represent a lower confidence rating that the bit values are 1 or 0, respectively. An LLR value of 0 may indicate that it is unknown whether the bit value is a 0 or 1 (e.g. it may be approximately a 50/50 chance at each).

FIG. 5 depicts five different LLR-LUTs, having different combinations of confidence ratings assigned to 0 and 1 bit values. Table 1 502 may be an example default or "base" LLR-LUT, with high confidence values of 7 and −7 assigned to 0 and 1 bit values, respectively. Table 2 504 may assign a high confidence to bit values of 0 (with a 7 LLR output), and a lower confidence LLR value of −3 to bit values of 1. Table 3 506 may still assign a high confidence LLR value to bit values of 0, but may assign an even lower confidence LLR value of 0 to bit values of 1. Table 4 508 may assign a high confidence LLR value of −7 to bit values of 1, and a lower confidence LLR value of 3 to bit values of 0. Table 5 may assign high confidence LLR values to bit values of 1, and may indicate that bit values of 0 are very unreliable with an LLR value of 0.

More complex LLR-LUTs than those shown in FIG. 5 may be used during re-read operations if the data fails to decode during an initial read. For example, if a bit location is read with three different read thresholds (e.g. based on the initial read and two re-reads), then all three bit values (e.g. 1 1 0) may be fed into an LLR-LUT with 8 potential inputs (for the 8 potential combinations of 3 bits, $2^3$), with each input having a different LLR output value. This additional "soft" information can provide greater accuracy regarding the reliability of individual bits. However, soft information-based recovery operations may include large performance penalties.

Since the LLR-LUTs used for an initial read may be basic, as depicted in FIG. 5, with only two potential inputs (0 or 1) and two corresponding outputs, the ability to compensate for different error situations is limited when only using a single LLR-LUT, as in the method of FIG. 4. In order to improve the performance of error correction decoding with hard information in an on-the-fly mode, multiple asymmetric LLR-LUTs can be applied based on a single read, instead of only using a single LLR-LUT. For example, the DSD may iterate through each of tables 1 through 5 of FIG. 5 after a single read, which may allow the DSD to recover from asymmetric read errors without the need for additional reads. An example iterative error correction decoding process with multiple LLR-LUTs is shown in FIG. 6.

Figure 6:
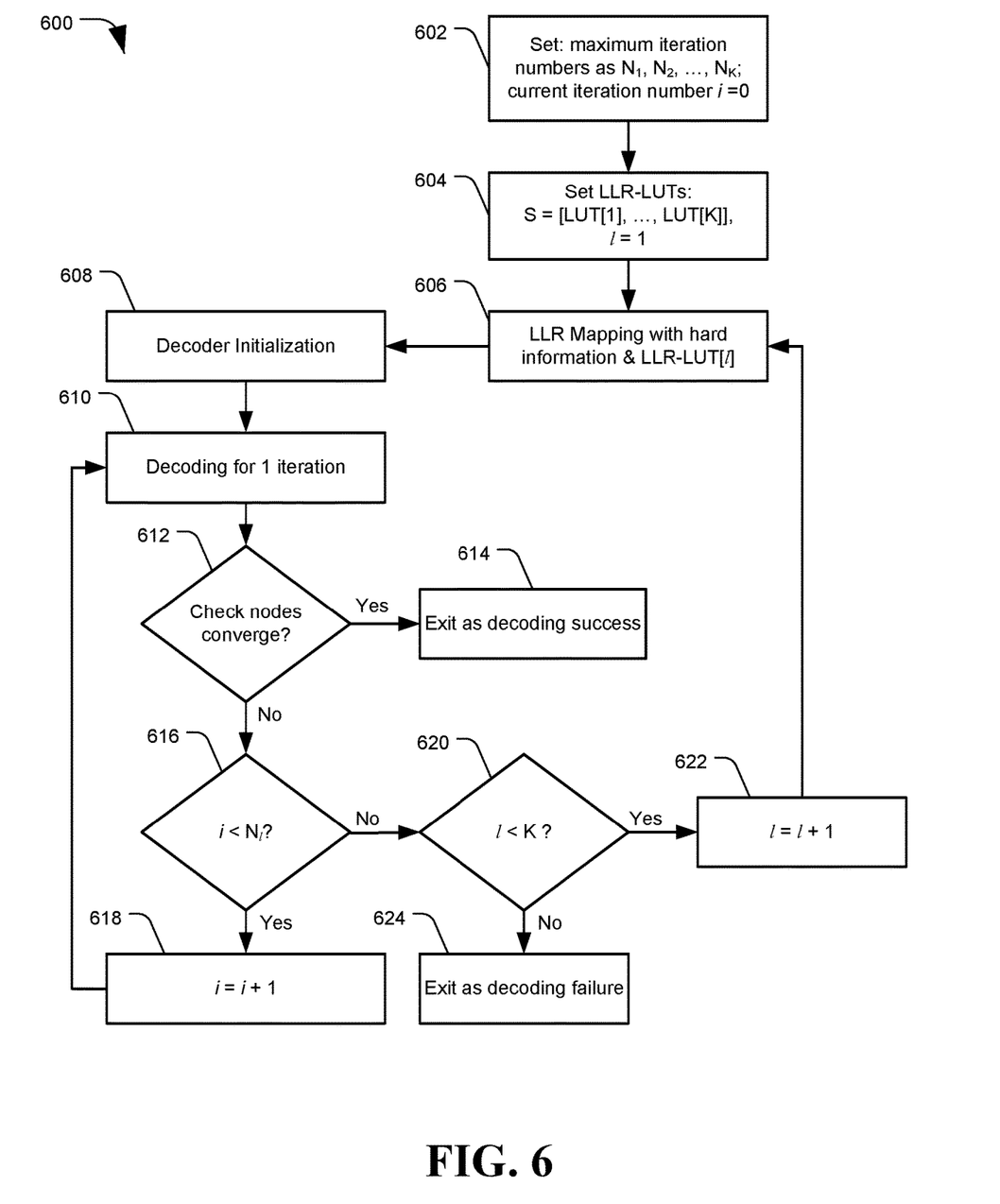
FIG. 6 is a flowchart of an example method of error correction with multiple LLR-LUTs for a single read, in accordance with certain embodiments of the present disclosure.

FIG. 6 is a flowchart of an example method 600 of error correction with multiple LLR-LUTs for a single read, in accordance with certain embodiments of the present disclosure. The method 600 may be performed by a data storage device (DSD), such as the DSD 200 of FIG. 2, via an error correction module (ECM) of the controller or the read channel circuit, via other components, or any combination thereof.

At 602, the method 600 may include setting a plurality "K" of maximum iteration numbers for an error correction and decoding process to selected values "$N_1$", "$N_2$", . . . , "$N_K$". Each maximum iteration number may correspond to a different LLR-LUT that will be employed during the on-the-fly decoding process, so that a number of decoding iterations will be performed using values from a selected LLR-LUT before moving on to a next LLR-LUT. A current iteration number "i" may also be set to 0, at 602.

The method 600 may also include pre-selecting "K" LLR-LUTs, comprising a set S=[LUT[1], LUT[K]], at 604. Each LUT may correspond to the K maximum iteration numbers of 602. A LUT iteration value "l" may be initialized to 1 in order to cycle through the select set S of LUTs. Different LLR-LUTs may be accessed during the decoding process based on a current iteration value "l" used as an index. For example, LLR-LUT[l] may be loaded into a register from a memory for use during the decoding operations. At 606, LLR mapping may be performed based on hard information (e.g. the initial bit value estimates) and LLR-LUT[l], starting with LUT[1].

The decoder may be initialized at 608, and a decoding iteration may be performed at 610. The decoding process with LUT[l] may be the same as the single-LUT case described in regard to FIG. 4. A check may be performed to determine whether the check nodes have converged at 612, and if so the method 600 may exit as a success at 614. If the check nodes do not converge, a determination of whether the current iteration number "i" is less than the current maximum iteration number $N_l$, at 616. If so, the current iteration number "i" is incremented at 618, and the decoder process continues to iterate based on the values from LLR-LUT[l], at 610.

If the current iteration value "i" is not less than $N_l$, the method 600 may include determining whether l is less than K, at 620. If so, then l is incremented, at 622, and the hard information bit estimates are applied to a next LLR-LUT[l] from the set S, at 606. The decoder may be re-initialized at 608, such that the decoder settings are reset to initial values in attempting to decode the data based on the new LLR values. Re-initializing the decoder may include sending an indication to hardware or an interrupt to the FW indicating that the decoder should be re-initialized to continue the decoding process.

If a determination is made that l is not less than K, at 620, then decoding operations using all of the LLR-LUTs from the set S may have been attempted without success. The method 600 may exit as a decoding failure, at 624, and an indication of the decoding failure may be sent to the FW, which may then attempt other error recovery operations.

The methodology of FIG. 6 provides flexibility to accommodate raw bit error asymmetries. For example, some codewords may favor symmetric LLR-LUTs as shown in Table 1 502 of FIG. 5, while other codewords may work better with asymmetric LLR-LUTs, as shown in Tables 2 through 5 of FIG. 5. Multiple LLR-LUTs could cover different corners of noise patterns without the performance penalties associated with performing re-reads.

To avoid additional time penalties from the multiple LLR-LUT scheme compared to the single LUT scheme of FIG. 4, the maximum iteration numbers can be chosen such as $\Sigma_{i=1}^{K} N_i = M$, such that the sum of the individual maximum iteration numbers $N_i$ is equal to the single maximum iteration value M of FIG. 4. In this manner, the total decoding iteration time may be approximately equal to the iteration time with a single LUT, except for some additional firmware overhead for decoder re-initialization. Note that $\Sigma_{i=1}^{K} N_i > M$ or $\Sigma_{i=1} N_i < M$ (e.g. additional or fewer total iterations relative to a single LUT scheme) may also be preferable depending on the data statistics, other NAND requirements, or any other factors. Another example of a method of applying multiple LLR-LUTs to a single read is depicted in FIG. 7.

Figure 7:
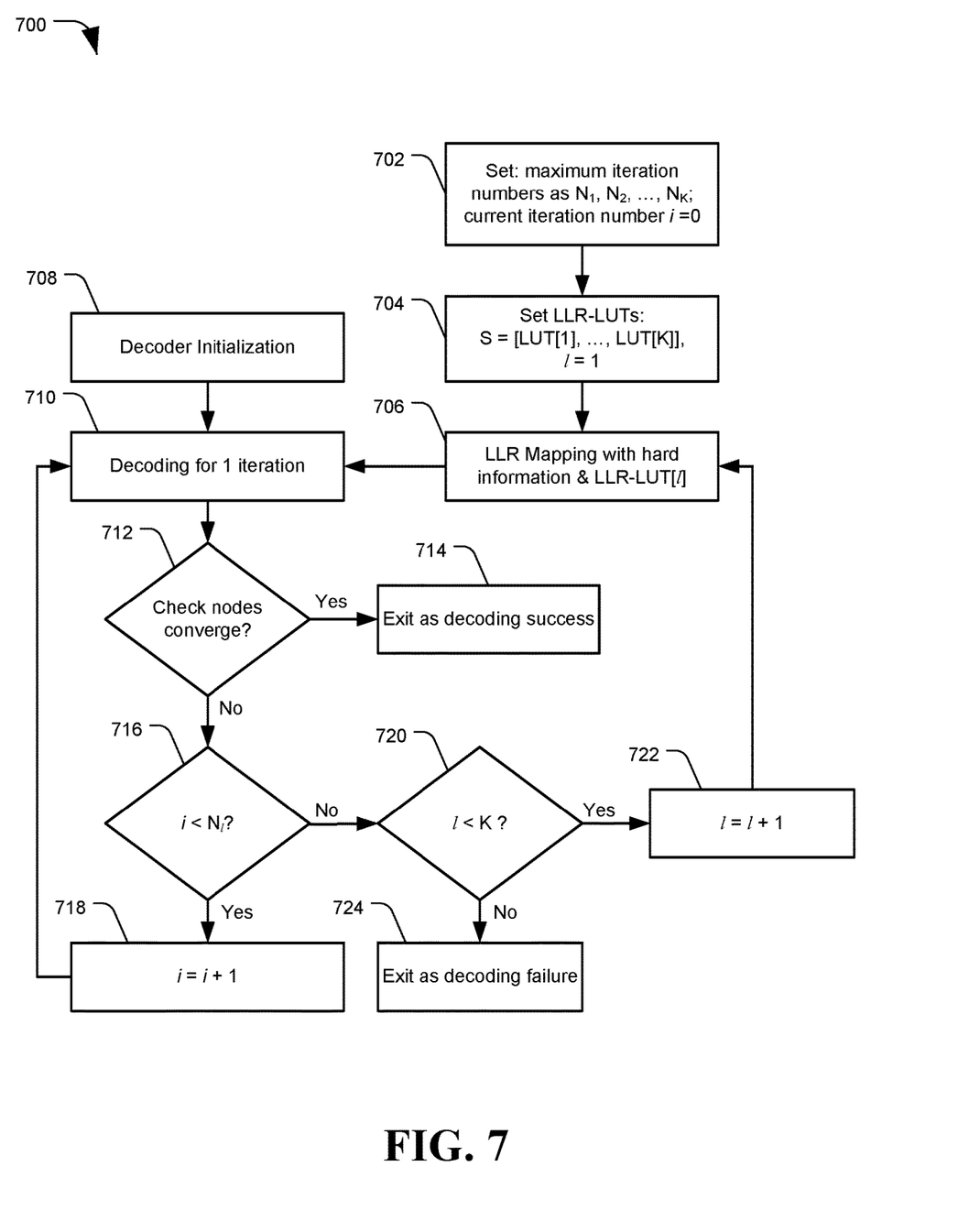
FIG. 7 is a flowchart of an example method of error correction with multiple LLR-LUTs for a single read, in accordance with certain embodiments of the present disclosure.

FIG. 7 is a flowchart of an example method 700 of error correction with multiple LLR-LUTs for a single read, in accordance with certain embodiments of the present disclosure. The method 700 may be performed by a data storage device (DSD), such as the DSD 200 of FIG. 2, via an error correction module (ECM) of the controller or the read channel circuit, via other components, or any combination thereof.

The method elements of FIG. 7 largely correlate to the elements of FIG. 6, and so discussion of most elements will be foregone to avoid repetition. The primary difference between the methodologies of FIGS. 6 and 7 is that in method 700, when switching to another LUT, the decoder does not get reset, at 708. In other words, the internal decoding states are set to initial values when decoding is first begun, and then any changes to the states are maintained even when switching to a different LUT. When the decoder starts decoding with the new LLR-LUT, it does not start from scratch, but continues with the decoding effort from the previous LLR-LUT. Maintaining the decoder state between LUT transitions has a number of potential advantages.

As a first benefit, there may be no need for the FW to intervene between different LLR-LUTs to reset the decoder. There may be some delay associated with notifying the FW that the decoder must be re-initialed and the FW completing the re-initialization. Avoiding the FW intervention in turn improves the utilization or the efficiency of the decoder, and improves the quality of service (QoS) by reducing delays in the decoding operation, since the decoder can stay busy throughout the decoding process Another advantage may be that the initial convergence attempts based on the first LLR-LUT may bring the codeword closer to convergence, and decoding with the second LLR-LUT would not require starting from initial conditions, but would allow for continuing where the initial LLR set left off. In other words, decoding attempts with subsequent LLR-LUTs can leverage on the effort the initial LLRs, increasing the chances of the codeword converging. Accordingly, it may be advantageous to first use moderate or balanced "base" or initial LLR-LUT that will likely produce some convergence, even if it does not result in full convergence. An LLR-LUT that is heavily biased towards the wrong type of errors (e.g. favoring 0-to-1 errors when 1-to-0 errors were more prevalent in the data) may actually push the codeword away from convergence in some circumstances.

Selection of a base or default LLR-LUT may be based on performance tests performed on a DSD during development or manufacture, which may reveal a pre-disposition towards a certain kind of asymmetric error. For example, if testing reveals that errors for a DSD have a 55% chance of being 0's read as 1's, and only a 45% chance of being 1's read as 0's, then a default LLR-LUT can be generated that has a lower confidence for 0s and a higher confidence for 1's. This approach may be applied to the embodiments of both FIGS. 6 and 7.

In some embodiments, the LLR-LUTs may be pre-generated and stored to a memory (e.g. a read-only memory, ROM) of the DSD during manufacture, and retrieved by the DSD during operation. In some examples, the DSD may be configured to generate or adjust LLR-LUTs based on observed errors during operation. Other embodiments are also possible.

Although exemplary embodiments discussed herein have been focused on hard iterative error correction decoding during an initial read, or "on-the-fly" mode, the teachings herein can also be applied to soft iterative error correction decoding during an error recovery mode. For example, the approach of FIG. 7 can also be applied to soft iterative error correction decoding, where multiple LLR-LUTs can be applied without resetting the decoder. Using multiple LLR-LUTs during soft information error recovery may reduce a number of re-read attempts required or otherwise improve the ability to recover unreliable data.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
a circuit configured to:
receive a sequence of bit value estimates as hard information for data read from a solid state memory during a single read operation using a selected read voltage threshold;
generate a first sequence of log likelihood ratio (LLR) values by applying the sequence of bit value estimates to a first lookup table (LUT);
perform a decoding operation on the first sequence of LLR values;
when the first sequence of LLR values fails to decode, generate a second sequence of LLR values by applying the sequence of bit value estimates to a second LUT, without performing a second read operation; and
perform the decoding operation on the second sequence of LLR values to generate decoded data.

2. The apparatus of claim 1 further comprising:
the first sequence of LLR values from the first LUT are based on a first confidence rating for the reliability of the 0's and 1's in the sequence of bit value estimates; and
the second sequence of LLR values from the second LUT are based on a second confidence rating for the reliability of the 0's and 1's in the sequence of bit value estimates.

3. The apparatus of claim 2 further comprising the first confidence rating and the second confidence rating assign a different reliability to 0 bit value estimates in the sequence of bit value estimates, such that the first sequence of LLR values and the second sequence of LLR values have a different chance to decode based on a number of erroneous 0 bit values in the sequence of bit value estimates.

4. The apparatus of claim 3 further comprising the first confidence rating and the second confidence rating assign a same reliability to 1 bit value estimates in the sequence of bit value estimates.

5. The apparatus of claim 2 further comprising the first confidence rating and the second confidence rating assign a different reliability to 1 bit value estimates in the sequence of bit value estimates, such that the first sequence of LLR values and the second sequence of LLR values have a different chance to decode based on a number of erroneous 1 bit values in the sequence of bit value estimates.

6. The apparatus of claim 5 further comprising the first confidence rating and the second confidence rating assign a same reliability to 0 bit value estimates in the sequence of bit value estimates.

7. The apparatus of claim 1 comprising the circuit further configured to:
when the second sequence of LLR values fails to decode, generate a third sequence of LLR values by applying the sequence of bit value estimates to a third LUT.

8. The apparatus of claim 1 comprising the circuit further configured to:
prior to performing the decoding operation on the first sequence of LLR values, initialize a decoder that performs the decoding operation, including initializing a parity check state;
update the parity check state during the decoding operation on the first sequence of LLR values;
do not re-initialize the decoder prior to performing the decoding operation on the second sequence of LLR values; and
further update the parity check state during the decoding operation on the second sequence of LLR values.

9. The apparatus of claim 1 comprising the circuit further configured to:
prior to performing the decoding operation on the first sequence of LLR values, initialize a decoder that performs the decoding operation, including setting a parity check state to an initial value;
update the parity check state during the decoding operation on the first sequence of LLR values; and
re-initialize the decoder prior to performing the decoding operation on the second sequence of LLR values, including resetting the parity check state to the initial value.

10. The apparatus of claim 1 further comprising:
the decoding operation includes applying a low-density parity check (LDPC) algorithm to the first sequence of LLR values to detect an encoded bit sequence from the sequence of bit value estimates.

11. A method comprising:
receiving, at a data channel circuit, hard information in the form of a sequence of bit value estimates for data read from a solid state memory during a single read operation;
generating a first sequence of log likelihood ratio (LLR) values by applying the sequence of bit value estimates to a first lookup table (LUT);
performing a decoding operation on the first sequence of LLR values;
when the first sequence of LLR values fails to decode, generating a second sequence of LLR values by applying the sequence of bit value estimates to a second LUT, without including soft information; and
performing the decoding operation on the second sequence of LLR values to generate decoded data.

12. The method of claim 11 further comprising:
the first LUT and the second LUT generate a different LLR value from 0 bit value estimates in the sequence of bit value estimates, such that the first sequence of LLR values and the second sequence of LLR values have a different chance to decode based on a number of erroneous 0 bit value estimates in the sequence of bit value estimates; and
the first LUT and the second LUT generate a same LLR value from 1 bit value estimates in the sequence of bit value estimates.

13. The method of claim 11 further comprising:
the first LUT and the second LUT generate a different LLR value from 1 bit value estimates in the sequence of bit value estimates, such that the first sequence of LLR values and the second sequence of LLR values have a different chance to decode based on a number of erroneous 1 bit value estimates in the sequence of bit value estimates; and
the first LUT and the second LUT generate a same LLR value from 0 bit value estimates in the sequence of bit value estimates.

14. The method of claim 11 further comprising:
prior to performing the decoding operation on the first sequence of LLR values, initializing a decoder that performs the decoding operation, including initializing a parity check state;
updating the parity check state during the decoding operation on the first sequence of LLR values;
not re-initializing the decoder prior to performing the decoding operation on the second sequence of LLR values; and further updating the parity check state during the decoding operation on the second sequence of LLR values.

15. The method of claim 11 further comprising:
prior to performing the decoding operation on the first sequence of LLR values, initializing a decoder that performs the decoding operation, including setting a parity check state to an initial value;
updating the parity check state during the decoding operation on the first sequence of LLR values; and
re-initializing the decoder prior to performing the decoding operation on the second sequence of LLR values, including resetting the parity check state to the initial value.

16. An apparatus comprising:
a circuit configured to:
execute a single read to a solid state memory to generate hard information in the form of a sequence of bit value estimates;
generate a plurality of log likelihood ratio (LLR) value sequences by applying the sequence of bit value estimates to a plurality of lookup tables (LUTs), without including soft information from a second read operation, each LUT configured to address different degrees of asymmetry in bit errors when reading 0's and when reading 1's;
perform a decoding operation based on the plurality of LLR value sequences, including:
select a selected LUT from the plurality of LUTs;
iteratively update a parity state based on a selected sequence of LLR values associated with the selected LUT;
when the selected sequence of LLR values fails to decode, select a next LUT from the plurality of LUTs as the selected LUT; and
produce decoded data when the selected sequence of LLR values successfully decodes.

17. The apparatus of claim 16 further comprising:
a first LUT and a second LUT from the plurality of LUTs generate a different LLR value from 0 bit value estimates in the sequence of bit value estimates, resulting in a first sequence of LLR values from the first LUT having a different chance to decode based on a number of erroneous 0 bit value estimates than a second sequence of LLR values from the second LUT.

18. The apparatus of claim 16 further comprising:
a first LUT and a second LUT from the plurality of LUTs generate a different LLR value from 1 bit value estimates in the sequence of bit value estimates, resulting in a first sequence of LLR values from the first LUT having a different chance to decode based on a number of erroneous 1 bit value estimates than a second sequence of LLR values from the second LUT.

19. The apparatus of claim 16 comprising the circuit further configured to:
prior to performing the decoding operation on a first sequence of LLR values from a first LUT in the plurality of LUTs, initialize a decoder that performs the decoding operation, including initializing the parity state;
update the parity state during the decoding operation on the first sequence of LLR values;
do not re-initialize the decoder prior to performing the decoding operation on a second sequence of LLR values from a second LUT in the plurality of LUTs, such that the parity state is maintained between the first sequence of LLR values and the second sequence of LLR values; and
further update the parity state during the decoding operation on the second sequence of LLR values.

20. The apparatus of claim 16 comprising the circuit further configured to:
prior to performing the decoding operation on a first sequence of LLR values from a first LUT in the plurality of LUTs, initialize a decoder that performs the decoding operation, including initializing the parity state;
update the parity state during the decoding operation on the first sequence of LLR values; and
re-initialize the decoder prior to performing the decoding operation on a second sequence of LLR values from a second LUT in the plurality of LUTs, such that the parity state is reset between the first sequence of LLR values and the second sequence of LLR values.

* * * * *